United States Patent
Kruip et al.

(10) Patent No.: US 6,937,126 B1
(45) Date of Patent: Aug. 30, 2005

(54) MAGNETIC COIL FORMER

(75) Inventors: Marcel Jan Marie Kruip, Oxfordshire (GB); Abdulbasad Shaikh, Greenford (GB)

(73) Assignee: Oxford Magnet Technology Limited, Oxford (GB)

( * ) Notice: Subject to any disclaimer, the term of this patent is extended or adjusted under 35 U.S.C. 154(b) by 257 days.

(21) Appl. No.: 10/111,445

(22) PCT Filed: Oct. 12, 2000

(86) PCT No.: PCT/GB00/03918

§ 371 (c)(1),
(2), (4) Date: Aug. 27, 2002

(87) PCT Pub. No.: WO01/31361

PCT Pub. Date: May 3, 2001

(30) Foreign Application Priority Data

Oct. 26, 1999 (GB) .................................. 9925169

(51) Int. Cl.[7] .............................................. H01F 1/00
(52) U.S. Cl. ...................................................... 335/296
(58) Field of Search ................................. 335/296–299

(56) References Cited

U.S. PATENT DOCUMENTS

| 4,385,277 | A | * | 5/1983 | Hanley | 324/309 |
| 5,101,638 | A | * | 4/1992 | White | 62/51.1 |
| 5,236,186 | A |   | 8/1993 | Weltin et al. | |
| 5,359,310 | A |   | 10/1994 | Pissanetzky | 335/301 |
| 5,402,094 | A |   | 3/1995 | Enge | 335/296 |
| 5,537,040 | A |   | 7/1996 | Ehnholm | |
| 5,982,260 | A | * | 11/1999 | Byrne | 335/216 |
| 6,396,376 | B1 | * | 5/2002 | Laskaris et al. | 335/299 |
| 6,504,461 | B2 | * | 1/2003 | Huang et al. | 335/296 |
| 6,538,545 | B2 | * | 3/2003 | Wakuda et al. | 335/296 |

FOREIGN PATENT DOCUMENTS

| EP | 0841737 | 5/1998 |
| GB | 2073500 | 10/1981 |
| GB | 2309305 | 7/1997 |
| GB | 2329762 | 3/1999 |
| WO | 88/04057 | 6/1988 |

* cited by examiner

*Primary Examiner*—Elvin Enad
*Assistant Examiner*—Bernard Rojas
(74) *Attorney, Agent, or Firm*—Crowell & Moring LLP

(57) ABSTRACT

The present invention is an improved magnet coil former for use in a magnetic resonance imaging (MRI) system. The improved magnetic coil former reduces the strength of the magnetic fields generated proximate the coils. This enables the coils to be driven at higher currents. The former consists of a substantially magnetically saturated ferromagnetic material and is arranged such that the compensating coil is magnetically attracted towards the former in a direction radially outward from the axis of the coils thereby reducing the collapsing hoop stress on the compensating coil. The former is made of Iron or other suitable ferromagnetic material. The former facilitates construction of a more compact MRI system.

8 Claims, 3 Drawing Sheets

MAGNETIC COIL FORMER

BACKGROUND OF THE INVENTION

The present invention relates to improvements in magnet coil formers. More specifically, the present invention relates to an improved magnetic coil former for use in a magnetic resonance imaging (MRI) system.

It is known to manufacture magnetic coils by winding a superconducting wire of suitable magnetic characteristics around a former. The former may be removed after the coil has been wound around it or it may be left in place.

Furthermore, it is known to use a pair of magnetic coils, often referred to in the art as drive coils, to generate a homogenous primary magnetic field suitable for use in an MRI system.

It is also known to use a pair of compensating magnetic coils which have currents running through them in opposite sense to the currents running through the drive coils. The compensating coils generate a magnetic field which functions to improve the homogeneity of the primary magnetic field.

U.S. Pat. No. 5,402,094 discloses an MRI magnet for mammography, in which the drive coil is mounted within the center of an annular ferromagnetic former, with compensating coils of increasing diameter mounted in groves within the annular former.

FIG. 1 shows a pair of known magnetic coil forms 10a and 10b. The formers are made of a non-ferromagnetic material such as stainless steel. Disposed of former 10a is driver coil 12a and compensating coil 14a. Similarly, disposed on former 10b is driver coil 12b and compensating coil 14b. The formers are arranged in parallel planes and have a common central axis Z. Coils 12a and 12b have larger radii than coils 14a and 14b. As is known in the art, drive coils arranged as such will generate a primary magnetic field $\bar{B}$ parallel to the central axis Z. Coils 14a and 14b will generate a compensating magnetic field which will have the well-known effect of improving the homogeneity of the primary magnetic field $\bar{B}$. A patient 35 lies in the space between the formers and in a plane parallel to the formers.

A technical problem exists with known magnetic coil type systems in that they suffer from excessive collapsing hoop stress. This occurs when the force of repulsion between the drive coil and the corresponding compensating coil is so great that the compensating coil requires substantial mechanical support means to prevent it from collapsing towards its central axis.

The collapsing hoop stress can be reduced by increasing the diameter of the drive coil with respect to the compensating coil. However, this has the negative effect of reducing the field of view of the MRI system.

Thus it is an object of the present invention to provide a coil former which reduces the collapsing hoop stress on the compensating coils.

It is a further object of the present invention to provide a coil former which reduces the peak magnetic field in the coils, thereby increasing the maximum allowable current in the coil's superconducting wire. Advantageously, this allows for a reduction in the amount of superconducting wire required to achieve the desired magnetic field strength.

It is yet a further object of the present invention to provide a coil former which facilitates the construction of a more compact MRI system.

SUMMARY OF THE INVENTION

According to the present invention these is provided a magnetic coil assembly for use in an MRI system, the assembly comprising a former and a coil, the former including means for supporting the coil, the coil being disposed on the former and arranged such that a current runs through the coil thereby generating magnetic fields, the former consisting of a substantially magnetically saturated ferromagnetic material, and the former being configured such that the magnetic fields generated proximate the coil are reduced in strength.

According to a further aspect of the present invention, the assembly further comprises a compensating coil, the former further includes means for supporting the compensating coil, the compensating coil being disposed on the former and arranged such that a further current runs through the compensating coil in an opposite sense to the current running through the coil, the compensating coil having a common axis with the coil and a diameter less than the diameter of the coil, and the former being further configured such that the compensating coil is magnetically attracted towards the former in a direction radially outward from the axis of the coils.

According to yet a further aspect of the present invention, there is provided an MRI system comprising a pair of magnetic coil assemblies, the pair of assemblies being disposed in parallel planes and having a common axis such that a primary magnetic field is generated in an area between the parallel planes and is parallel to the common axis.

According to yet a further aspect of the present invention, there is provided a ferromagnetic former for use in a magnetic coil assembly, the former comprising means for supporting a coil, the former arranged proximate the coil such that strength of magnetic fields generated by the coil is reduced.

Other objects, advantages and novel features of the present invention will become apparent from the following detailed description of the invention when considered in conjunction with the accompanying drawings.

DETAILED DESCRIPTION OF THE INVENTION

Figure 2:
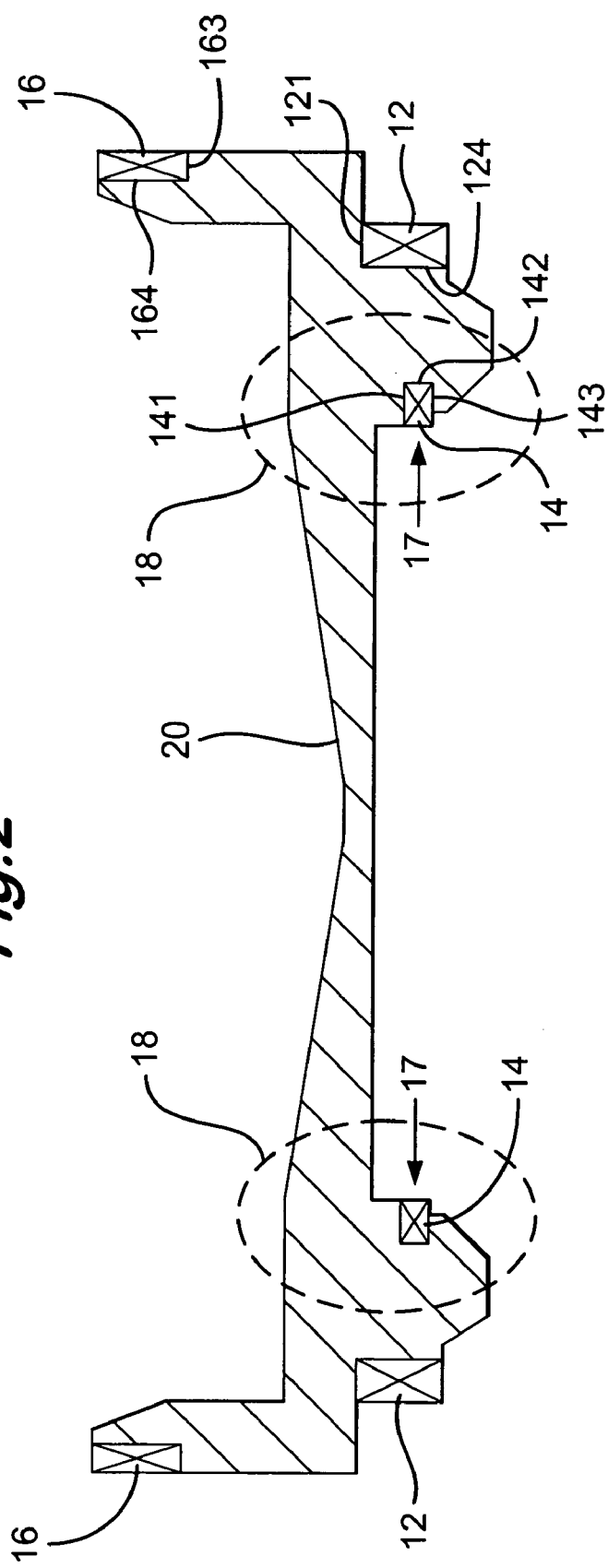
FIG. 2 is a ferromagnetic coil former.

In FIG. 2, coil former 20 serves as a mechanical support for drive coil 12, compensating coil 14, and shielding coil 16. The coils are wound around the former in a manner well known in the art. The coils are superconducting magnetic coils. The former is shaped in such a way so as to surround the coils with as much of the former as possible. For example, drive coil 12 is enclosed by the former on sides 121 and 124. Compensating coil 14 is enclosed by the former on sides 141, 142, and 143. Shielding coil 16 is enclosed by the former on sides 164 and 163. The operation and function of the drive coil 12, compensating coil 14, and shielding coil 16 are well known in the art.

The former is made of a ferromagnetic material. In this preferred embodiment the ferromagnetic material is Iron. As will be appreciated by those skilled in the art other ferromagnetic material may be used, such as Nickel, Cobalt, Holmium, or alloys thereof, without departing from the scope of the present invention.

The effect of enclosing a superconducting coil with a large mass of ferromagnetic material is to reduce the peak magnetic field being generated within a coil. Reducing the peak magnetic field allows for a higher current to be passed through the superconducting wires of the coil. Thus the amount of superconducting wire required in a coil to generate a desired magnetic field is reduced. This substantially reduces the cost of the coil. Alternatively, a stronger primary magnetic field can be generated by a coil with a ferromagnetic former than can be generated by the same coil with a non-ferromagnetic former.

The former 20 in FIG. 2 is designed to maximize the mass of the former around each coil, reducing the peak magnetic field generated by each coil and thereby reducing the amount of wire needed to make each coil. The mass of the former away from the coils is minimized in order to reduce the weight of the former and the same on material costs. The specific shape of former 20 is selected to maximize the homogeneity of the primary magnetic field generated by the drive coils.

The former 20 further functions to reduce the collapsing hoop stress on compensating coil 14. Compensating coil 14 has a natural tendency to collapse in on itself. In FIG. 2 the area encircled by broken line 18 is substantially magnetically saturated. Thus the compensating coil 14 is magnetically attracted to the ferromagnetic former 20 in an outward radial direction as indicated by arrow 17. This has the advantageous effect of reducing the collapsing hoop stress on the compensating coil, without requiring additional mechanical supports.

Coils 12, 14, 16 are preferably superconducting coils and thus require some form of temperature control. The preferred method of controlling the temperature of superconducting coils is to dispose the coils in a cryostat. Due to the close proximity of the coils to the former, the former must also be temperature controlled. This can be achieved by the same means which controls the superconducting coils. Alternatively, the former may be temperature controlled separately with, for example, a Peltier device.

Figure 1:
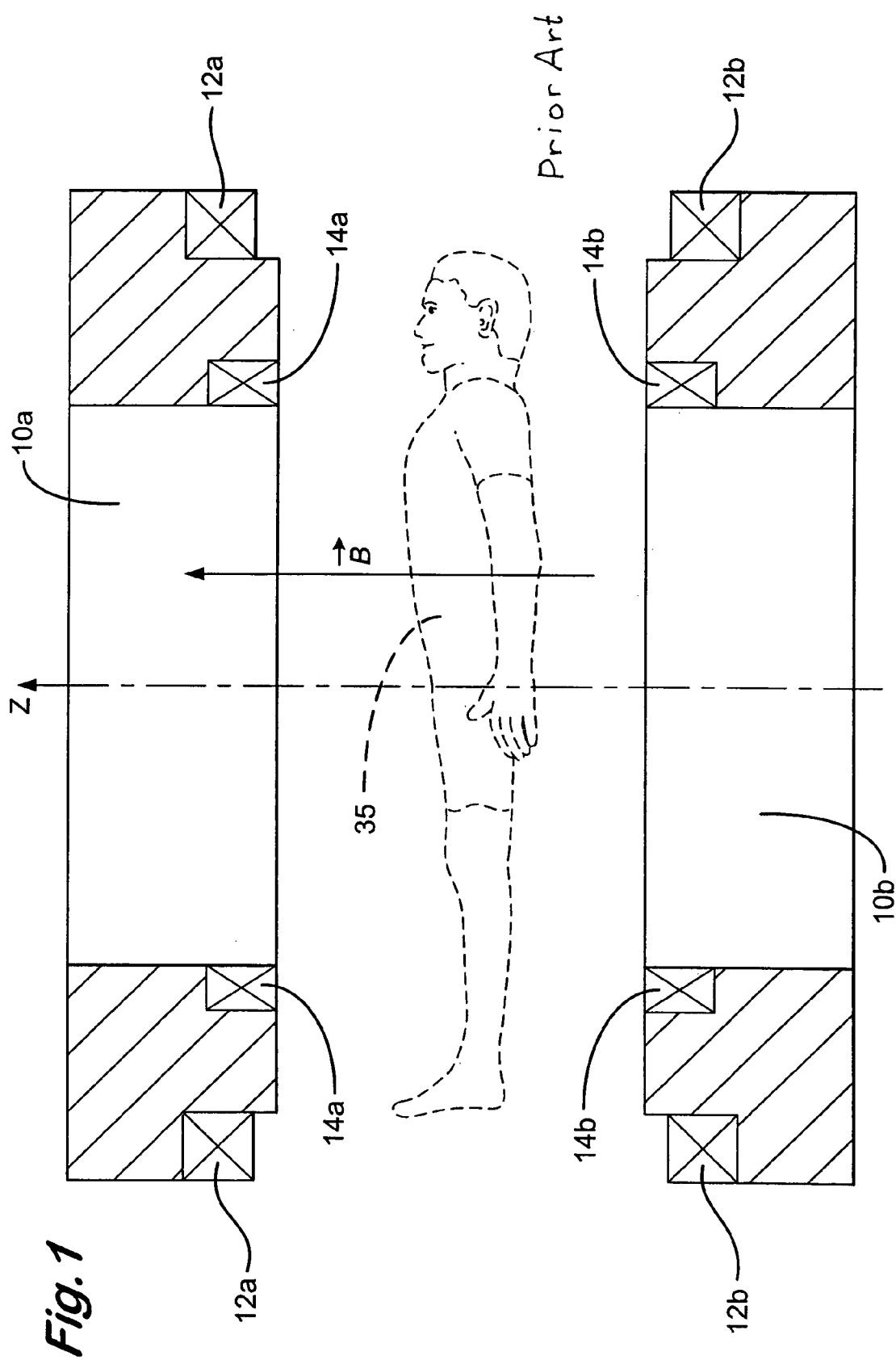
FIG. 1 shows a pair of known magnetic coil reformers.
Figure 3:
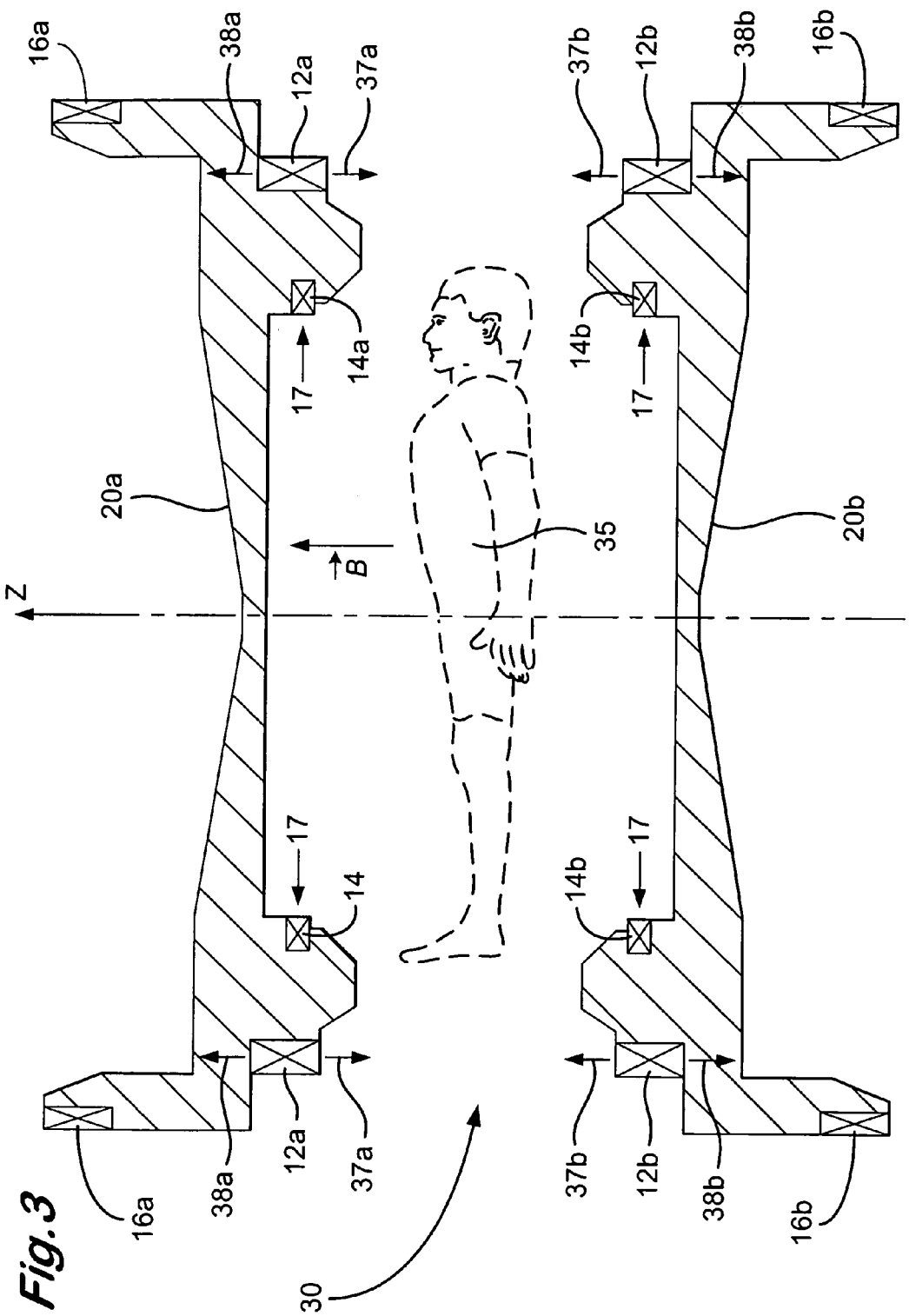
FIG. 3 is an MRI system incorporating the ferromagnetic coil former shown in FIG. 2.

In FIG. 3, MRI system 30 is shown comprising a pair of ferromagnetic formers 20*a*, 20*b*. Ferromagnetic formers 20*a*, 20*b* comprise a pair of drive coils 12*a*, 12*b*, a pair of compensating coils 14*a*, 14*b*, and a pair of shielding coils 16*a*, 16*b*. As in FIG. 1 the formers are disposed in parallel planes and have a common central axis Z. The dirve coils generate a primary magnetic field $\overline{B}$ in a plane parallel to the central axis. The compensating coils generate further magnetic fields to improve the homogeneity of the primary magnetic field. The shielding coils function to reduce magnetic field leakage into the area surround the MRI system. A patient 35 is situated between the pair of formers 20*a*, 20*b* in a plane parallel to the plane of the formers.

The use of a ferromagnetic material in the formers serves to increase the primary magnetic field generated by the drive coils by as much as 30%. The drive coils 12*a*, 12*b* are attracted towards each other in an inward axial direction, shown by the arrows 37*a*, 37*b*. By using magnetically saturated ferromagnetic formers the drive coils are also attracted toward their respective formers in an outward axial direction, shown by the arrows 38*a*, 38*b*. Provided the ferromagnetic former is of sufficient size, the force of attraction of each drive coil outwardly towards its former will be greater than the force of attraction of the drive coils inwardly towards each other. Advantageously, this reduces the need for mechanical support under each drive coil.

Furthermore, this allows the drive coils to be located closer together in an axially direction. For example, former 20*a* may be moved closer to former 20*b* along the central axis Z. This has the advantageous effect improving the efficiency of the primary magnetic field $\overline{B}$ and of reducing adverse second order effects produced by the drive coils. Furthermore, this allows for the diameter of the drive coils to be reduced. For example, an MRI system having a non-ferromagnetic former and 2.5 meter diameter drive coils will have substantially the same primary magnetic field efficiency as an MRI system having a ferromagnetic former and drive coils with less than 2 meter diameters. As is well know, smaller diameter drive coils allows for an overall reduction in the size of the MRI system and in the cost.

Advantageously, the ferromagnetic formers function to reduce magnetic field leakage, thus reducing the requirements for shielding coils in the MRI system.

In MRI systems which require lower magnetic field strength, the presence of the ferromagnetic formers can reduce or eliminate the need for compensating coils.

As will be appreciated by those skilled in the art, various modifications may be made to the embodiment hereinbefore described without departing from the scope of the present invention.

What is claimed is:

1. A magnetic coil assembly for use in an MRI system, said assembly comprising:
    a former;
    an annular drive coil; and
    an annular compensating coil; wherein,
    the former includes means for supporting the drive coil and means for supporting the compensation coil;
    the drive coil is disposed on the former, and is arranged to receive a current to run through the drive coil in a first direction, thereby generating magnetic fields;
    the compensating coil is disposed on the former, and has a common axis with the drive coil;
    the compensating coil is arranged to receive a further current to run through the compensating coil in a second direction, opposite to the first direction;
    the compensating coil has a diameter less than a diameter of the drive coil;
    the former is made of an easily magnetically saturated ferromagnetic material; and
    the former is configured to surround the compensating coil on axial sides and radially outer sides thereof, such that the compensating oil is magnetically attracted towards the former in a direction radially outward from the common axis.

2. An assembly as claimed in claim 1, wherein:
    the assembly further comprises a shielding coil;
    the former further includes means for supporting the shielding coil; and
    the shielding coil is disposed on the former and arranged to reduce leakage of magnetic fields from the assembly.

3. An assembly as claimed in claim 1, wherein the drive coil is magnetically attracted towards the former in an axial direction.

4. An assembly as claimed in claim 1, wherein the ferromagnetic material is Iron.

5. An assembly as claimed in claim 1, wherein the drive coil is a superconducting coil.

6. An MRI system comprising a pair of magnetic coil assemblies, each being as claimed in claim 1, the pair of assemblies being disposed in parallel planes about the common axis such that a primary magnetic field may be generated by the drive coils, between the parallel planes in a direction parallel to the common axis.

7. A ferromagnetic former for use in a magnetic coil assembly as defined in claim 1.

8. An MRI system including the ferromagnetic former as claimed in claim 7.

* * * * *